(12) United States Patent  
Thies et al.

(10) Patent No.: US 7,154,344 B2
(45) Date of Patent: Dec. 26, 2006

(54) VERSATILE FEEDBACK SYSTEM FOR PHASE LOCKED LOOP ARCHITECTURE

(75) Inventors: William Thies, Quaix en Chartreus (FR); Chris Lawley, Worcester (GB)

(73) Assignee: STMicroelectronics Limited (GB)

( * ) Notice: Subject to any disclaimer, the term of this patent is extended or adjusted under 35 U.S.C. 154(b) by 0 days.

(21) Appl. No.: 11/016,690

(22) Filed: Dec. 17, 2004

(65) Prior Publication Data

US 2005/0275473 A1   Dec. 15, 2005

(30) Foreign Application Priority Data

Dec. 19, 2003   (EP)   .................... 03258081

(51) Int. Cl.
*H03L 7/10*   (2006.01)
*H03L 7/18*   (2006.01)

(52) U.S. Cl. .................. 331/16; 331/18; 331/25; 331/DIG. 2

(58) Field of Classification Search ............ 331/1 A, 331/8, 10, 11, 16–18, 25, DIG. 2; 327/156–159; 332/127; 360/51; 375/376; 455/260
See application file for complete search history.

(56) References Cited

U.S. PATENT DOCUMENTS

| 5,610,955 | A | 3/1997 | Bland |
| 6,553,057 | B1 | 4/2003 | Sha et al. |
| 6,700,446 | B1 * | 3/2004 | Ke .............................. 331/1 A |
| 6,744,323 | B1 * | 6/2004 | Moyal et al. ................ 331/1 A |

OTHER PUBLICATIONS

Yiwu Tang et al.: "A low-noise fast-settling PLL with extended loop bandwidth enhancement by new adaptation technique", Proceedings 14th Annual IEEE International ASIC/SOC Conference (IEEE Cat. No. 01TH8558), Arlington, VA, USA, Sep. 12, 2001,-Sep. 15, 2001, pp. 93-97, XP002272697.

Yiwu Tang et al.: "A new fast-settling gearshift adaptive PLL to extend loop bandwidth enhancement in frequency synthesizers", 2002 IEEE International Symposium on Circuits and Systems, Porceedings (Cat. No. 02CH37353), Phoenix, AZ, USA, vol. 4, May 26, 2002,-May 29, 2002, pp. 787-790, XP002272698.

* cited by examiner

*Primary Examiner*—David Mis

(57) ABSTRACT

A phase locked loop (PLL) circuit comprising: feedback division circuitry for receiving an output signal, the feedback division circuitry arranged to divide the output signal by a first division factor in a first mode of operation, and a second division factor in a second mode of operation.

24 Claims, 5 Drawing Sheets

VERSATILE FEEDBACK SYSTEM FOR PHASE LOCKED LOOP ARCHITECTURE

TECHNICAL FIELD OF INVENTION

The present invention is related to Phase-Locked Loop (PLL) architecture.

BACKGROUND OF THE INVENTION

A known charge-pumped PLL 10 is shown in FIG. 1 and includes a phase frequency detector (PFD) 11 that accepts as inputs a reference signal and a feedback signal. The PFD has an "up" output and a "down" output that are connected to a charge pump 12, which drive a filter 13. The voltage output of the filter 13 controls the frequency of a voltage-controlled oscillator (VCO) 14. The output of the VCO 14 is taken as the output of the PLL and is also fed back to a feedback divider 16 that divides the frequency of the VCO output. The output of the feedback divider 16 is the feedback signal supplied to one input of the PFD 11.

In use, the PFD 11 modulates the up and down pulse signals depending upon whether the feedback signal is leading or lagging the reference signal. The up and down pulses are continuously generated such that when the feedback signal is in phase with the reference signal the pulses of the up and the down signals have the same width. If the feedback signal begins to lag the reference signal, then the pulse width of the up signal is increased. If the feedback signal begins to lead the reference signal, then the pulse width of the down signal is increased. Thus the duty cycle of the up or down signals is varied in accordance with the phase or frequency difference of the signals input to the PFD.

The outputs of the PFD 11 are integrated by an integrator 15 to produce a control voltage. The integrator 15 comprises the charge pump 12 and the filter 13. The up and down pulses are translated into a current by the charge pump, which either forces current into or out of the filter, which may be a loop filter. The filter integrates the current and generates a control voltage that is input to the VCO.

For a PLL to lock onto a reference signal, the frequency divider 16 must function up to the VCO maximum frequency. Due to process, voltage and temperature (PVT) variations, the VCO maximum frequency may be much higher than the desired output frequency of the PLL. Hence the feedback divider 16 will be required to have an equally high maximum input frequency. The problem is exacerbated in applications where high-resolution is desirable, in these cases complex division circuitry may be needed, which typically has a relatively lower frequency response.

In these PLLs, it is necessary to design the feedback divider so as to have an appropriate input frequency range, according to the properties of the Voltage Controlled Oscillator (VCO). Further, the feedback divider determines the frequency resolution of the PLL, and the output frequency of the VCO. The smaller the division factor N in the feedback divider, the finer the resolution of the PLL output frequency. However, a small division factor N gives a lower output frequency.

Embodiments of the present invention may decorrelate the VCO maximum frequency from the divider complexity. Removing this design constraint will reduce the design time required to generate a PLL for a specific use.

Embodiments of the present invention may provide a PLL that has both a fine frequency resolution and a maximum output frequency close to the VCO maximum output frequency.

SUMMARY OF THE INVENTION

To address the above-discussed deficiencies of the prior art, according to the present invention there is provided a phase locked loop (PLL) circuit comprising: feedback division circuitry for receiving an output signal, the feedback division circuitry arranged to divide the output signal by a first division factor in a first mode of operation, and a second division factor in a second mode of operation.

The foregoing has outlined rather broadly the features and technical advantages of the present invention so that those skilled in the art may better understand the detailed description of embodiments of the invention that follows. Additional features and advantages of the invention will be described hereinafter that form the subject of the claims of the invention. Those skilled in the art should appreciate that they may readily use the concept and the specific embodiment disclosed as a basis for modifying or designing other structures for carrying out the same purposes of the present invention. Those skilled in the art should also realize that such equivalent constructions do not depart for the scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; and the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, in which like reference numerals represent like parts, and in which.

DETAILED DESCRIPTION OF THE INVENTION

FIGS. 2 through 5, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged phase locked loop.

Figure 1:
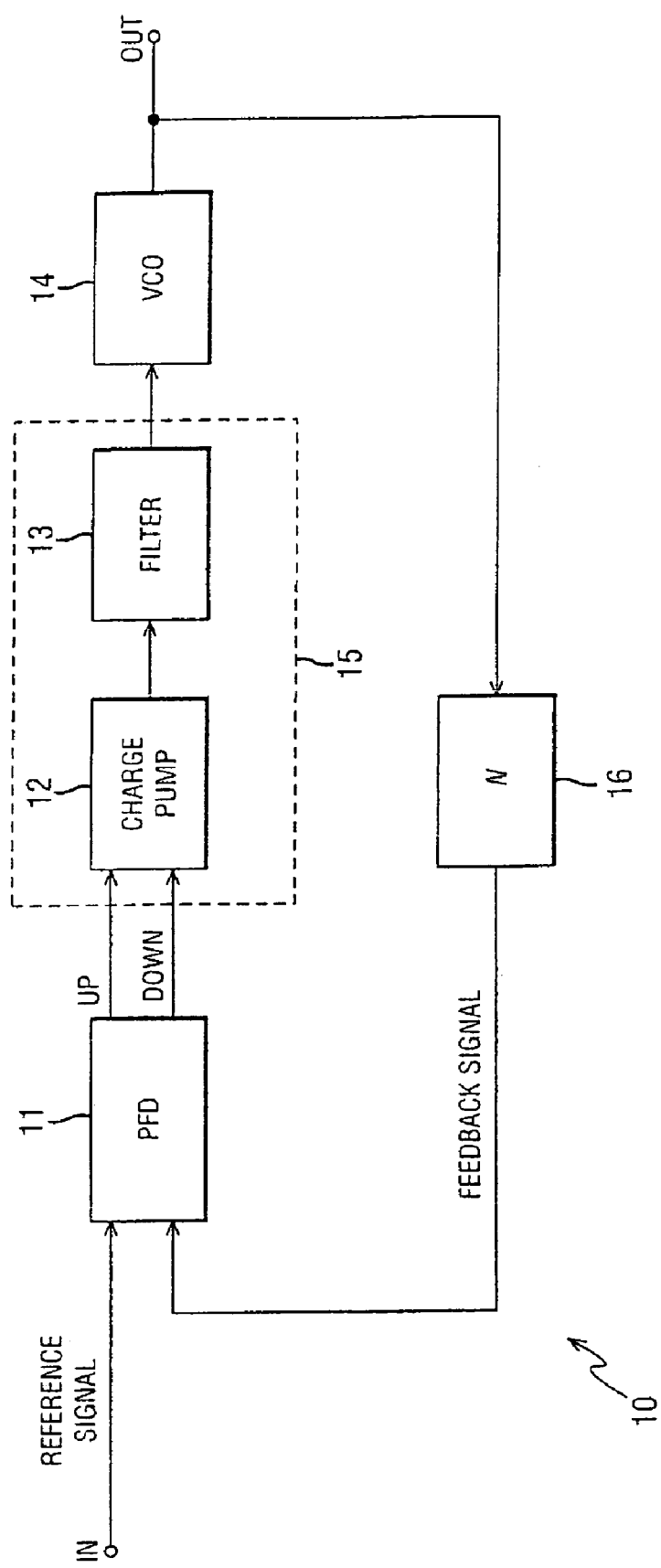
FIG. 1 is a schematic diagram of a known PLL circuit.
Figure 2:
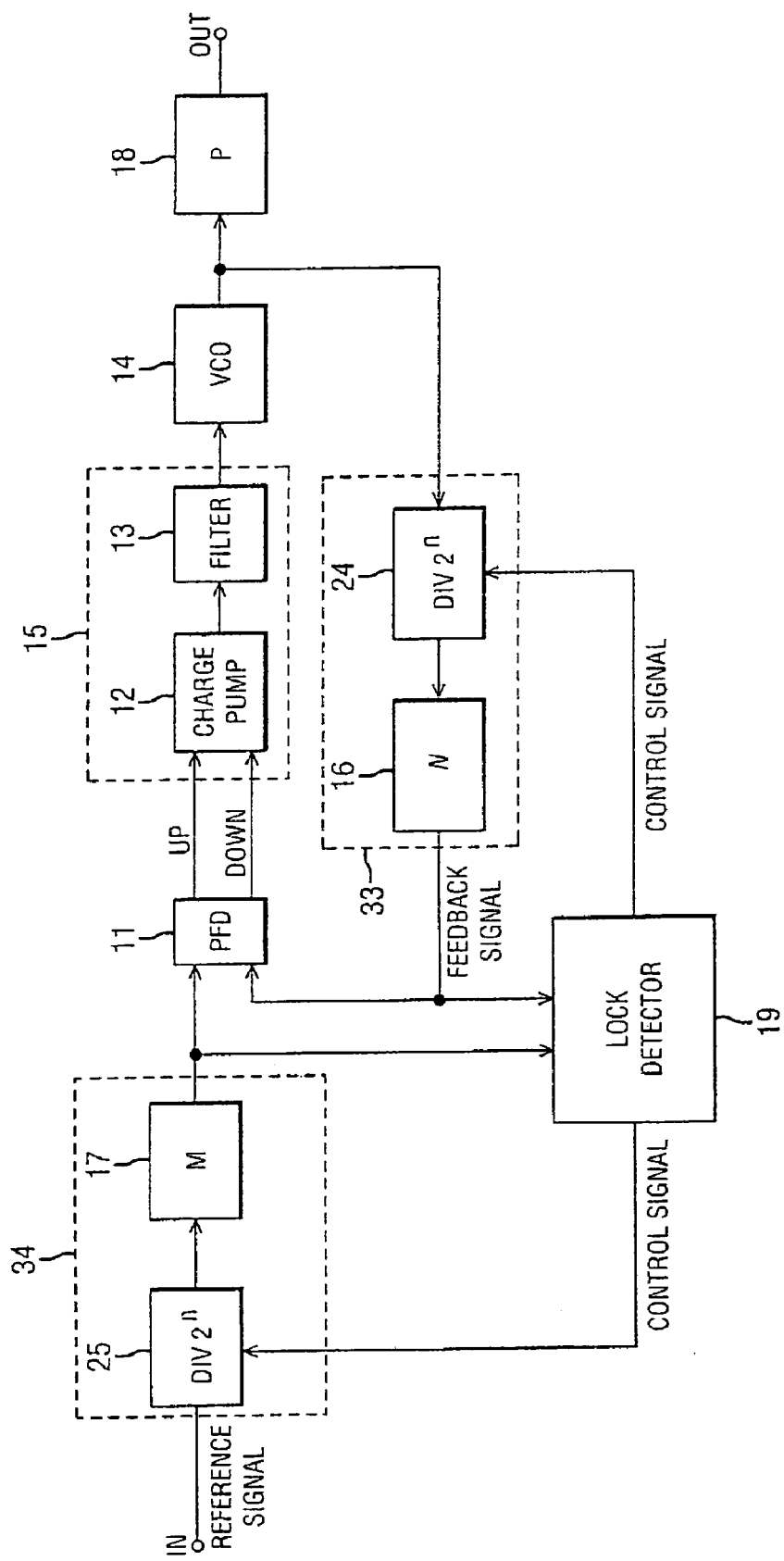
FIG. 2 is a schematic diagram of a PLL circuit embodifying the invention.

FIG. 2 shows a phase locked loop (PLL) according to a preferred embodiment of the present invention. The elements which perform a similar function to those shown in FIG. 1 will be referred to by the same reference number. The phase frequency detector 11, charge pump 12, filter 13 and VCO 14 perform a similar function as described above with reference to FIG. 1. The reference frequency is input to a second dynamically switchable divider circuit 25, which divides by $2^n$, the output of which is connected to a pre-divider 17 that divides by M. The output of the pre-divider 17 is a pre-divided input reference signal that is input to the phase frequency detector 11 and the lock detector 19. The output of the VCO 14 is connected to a post-divider 18, which divides by P. The post-divider is used to convert the output of the VCO to a lower desired frequency. The output of the VCO is also connected to a first dynamically switchable divider circuit 24 that divides by $2^n$, which in turn is connected to a feedback divider 16 that divides by N. The output of the feedback divider 16 is a divided feedback signal that is input to the phase frequency detector 11 and the lock detector 19. The lock detector 19 outputs a control signal to both the first and second dynamically switchable divider circuits 24 and 25.

In embodiments of the present invention the post-divider, used to convert the output of the VCO to a lower desired frequency, improves the output resolution of the PLL.

The lock detector 19 counts pulses in the outputs of the pre-divider 17 and feedback divider 16 in order to ascertain whether a coarse lock has been established or not. For example, the lock detector 19 may determine that a coarse lock has been established when there is a frequency difference of less than 1 pulse in 1000 pulses output by the pre-divider 17 and feedback divider 16. Alternatively, the lock detector may determine that a coarse lock has been established when there is a frequency difference of less than 1 pulse in 10,000 pulses output by the pre-divider 17 and feedback divider 16. It should be appreciated that any suitable level can be defined as indicating a coarse lock has been established. When the lock detector determines that a coarse lock has been established it asserts a control signal to the first and second dynamically switchable divider circuits 24 and 25.

Each of the dynamically switchable divider circuits 24 or 25 has two modes of operation, determined by the state of the control signal received from the lock detector 19. In a divide mode, when the control signal is not asserted, the dynamically switchable divider circuits 24, 25 divide the input signal by $2^n$, where n is an integer, and outputs the divided signal. In a pass through mode, when the control signal is asserted by the lock detector 19, the dynamically switchable divider circuits 24, 25 output the input signal unmodified.

Figure 4:
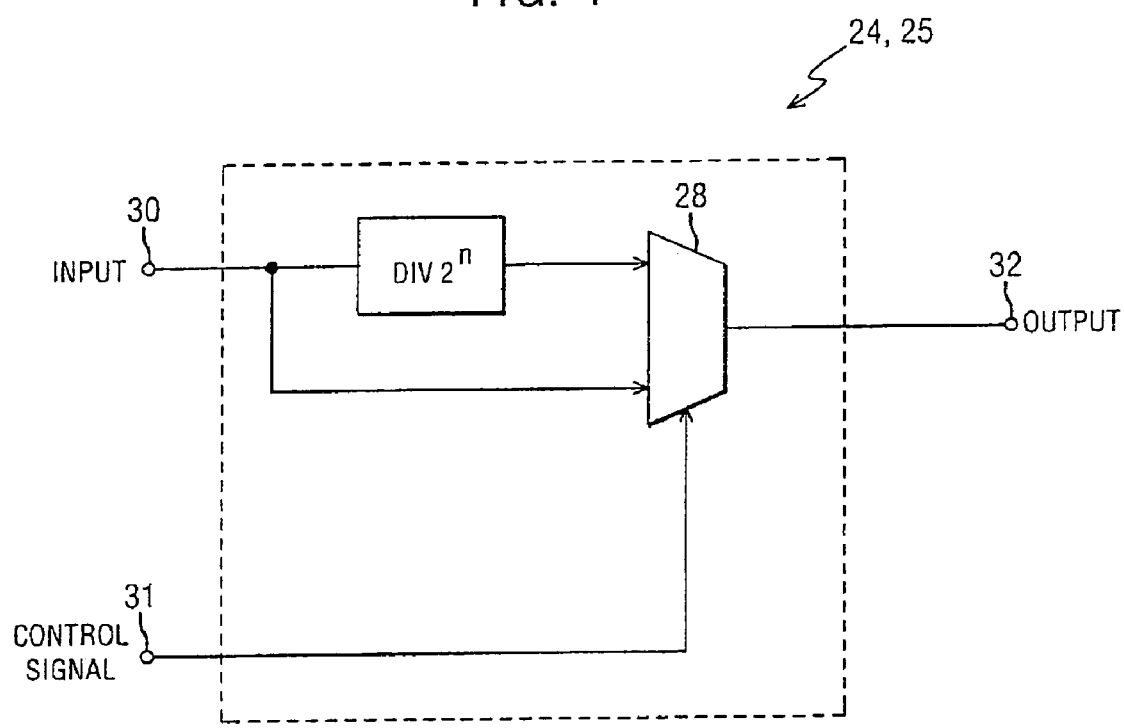
FIG. 4 is a schematic diagram of an embodiment of a dynamically switchable divider circuit.

One arrangement for a dynamically switchable divider circuit 24 or 25 is shown in FIG. 4 where the dynamically switchable divider circuit 24 or 25 comprises a divider circuit 29 that divides by $2^n$ and a multiplexer 28 which is controlled by the control signal asserted at connection 31 from the lock detector 19. An input 30 of the dynamically switchable divider circuit 24 or 25 is connected directly to one input of the two input multiplexer 28 and also via a divider circuit 29, which divides by $2^n$, to the other input of the multiplexer 28. An output 32 of the multiplexer is the output of the dynamically switchable divider circuit 24 or 25.

When the control signal from the lock detector 19 is asserted, the multiplexer 28 is controlled to output the input signal 39 in its undivided form. When the control signal from the lock detector is not asserted, the output from the divider circuit 29 is output by the multiplexer. Thus the multiplexer 28 is controlled by the control signal to output the input signal in either undivided or divided form.

The mode of operation of the circuit shown in FIG. 2 will now be described. In an initial state the output of the voltage controlled oscillator 14 is not locked to the input reference signal and the control signal output by the lock detector 19 is not asserted. In this state both the first and second dynamically switchable divider circuits 24 and 25 perform a $2^n$ division on a signal input thereto.

A feedback division factor may be defined as the frequency ratio between the frequency output by the voltage controlled oscillator 14 and the frequency of the feedback signal input to the phase frequency detector 11, and is determined by feedback division circuitry 33. A pre-division factor may be defined as the frequency ratio between the frequency of the reference signal input to the PLL and the frequency of the reference signal input to the phase frequency detector, and is determined by pre-division circuitry 34. In FIG. 2, the feedback division circuitry 33 comprises the first dynamically switchable divider circuit 24 and the feedback divider 16; and the pre-division circuitry 34 comprises the second dynamically switchable feedback divider circuit 25 and the feedback divider 17.

In this mode the feedback division factor is the product of N and $2^n$. This mode may be referred to as a coarse lock mode and the PLL circuit may be said to be operating in a first lock zone.

The coarse lock mode has the advantage that the output of the voltage controlled oscillator 14 is input to the switchable divider circuit 24. As understood by those skilled in the art, a circuit that divides by $2^n$ is less complex and has a higher frequency response than a circuit that divides by N, where N is some arbitrary value. A divide by 2 circuit may be created using the toggling capability of a JK flip-flop, this is a known method for halving the frequency of a signal. n of such appropriately configured flip flops may be attached in series to produce a divide by $2^n$ circuit. Such a circuit may be known as a binary counter. A divide by N circuit may require further logic in order to create a suitable counter, which can have a negative impact on frequency response.

In the coarse lock mode, the reference signal input to the phase locked loop is divided by both $2^n$ and by M, to create a pre-divided reference signal. The division by $2^n$ is performed by the second dynamically switchable divider circuit 25. The division by M is performed by the pre-divider 17. The pre-divided reference signal is input to the phase frequency detector 11. In this mode the feedback signal output from the voltage controlled oscillator 14 is divided by both $2^n$ by the first dynamically switchable divider circuit 24, and by N by the feedback divider circuit 16, before being input to the phase frequency detector 11. In the coarse lock mode, the phase frequency detector 11 and integration circuit 15 function as previously described so as to lock the output of the voltage controlled oscillator 14 to the input reference signal.

Once a coarse lock threshold is reached, as determined by the lock detector 19, the PLL switches to a fine lock mode. In this mode, the PLL circuit may be said to be operating in a second lock zone. A control signal is asserted by the lock detector 19 to the first and second dynamically switchable divider circuits 24 and 25 causing them to switch from the divide mode to the pass through mode. In other words, these dividers do not change the frequency of the signal input to them. Once the control signal is asserted by the lock detector 19, the PLL is in the fine lock mode wherein the division feedback factor is N. In this mode the output of the voltage control oscillator is input to the feedback divider 16 without any change to the frequency, and the input reference signal is passed through directly to the pre-divider 17, again without any change to the frequency. It should appreciated that the ratio between the pre-divided input reference signal and the divided feedback signal is constant regardless of whether the PLL is in a coarse lock mode or a fine lock mode, and as such the output frequency of the VCO is substantially unchanged. However, in the fine lock mode the PLL has an increased resolution due to the lower feedback division factor. Thus, it is possible in the fine lock mode for the PLL to produce an output frequency with reduced output fluctuations.

The circuit described above has two lock zones, each with different feedback division factors. A two-stage process is provided for locking the frequency of the PLL output to the frequency of the input reference signal. In the first lock zone, the feedback division factor is relatively large, and therefore the feedback circuitry may accommodate the maximum output frequency of the VCO. In the second lock zone the feedback division factor is relatively small, and therefore the feedback circuit has a relatively higher resolution providing greater accuracy in the output frequency of the VCO.

In an alternative embodiment of the present invention, the positions of the second dynamically switchable feedback divider 25 and the pre-divider 17 are swapped. This results in the reference signal being input to the pre-divider 17 the output of which is connected to the second dynamically switchable divider circuit 25. The output of the second dynamically switchable divider circuit 25 is in turn connected to one of the inputs of the phase frequency detector 11. This circuit will perform in the same manner as described above with reference to FIG. 2.

Another alternative embodiment of the present invention will now be described with reference to FIG. 3. This circuit is similar in construction and operation to the circuit shown in FIG. 2 and described above; here the differences are described. The same reference numbers are used for the same parts. In summary, in this embodiment the second dynamically switchable divider circuit 25 that is part of the pre-division circuitry 34 is omitted, and the feedback divider is now switchable.

The reference signal is input to the pre-divider 17, which in turn is connected to the phase frequency detector 11 and the lock detector 19. The control signal output by the lock detector is input to a dynamically switchable divider circuit 24 and a switchable feedback divider 26. The output of the voltage controlled oscillator 14 is connected to the dynamically switchable divider circuit 24, which in turn is connected to an input of the switchable feedback divider 26. The output of the switchable feedback divider 26 is connected to one of the inputs of the phase frequency detector 11.

In a first mode of operation, a coarse lock mode, the lock detector 19 does not assert the control signal. The switchable feedback divider 26 is capable of dividing the input signal by a factor of either N or N' the factor being determined by the state of the control signal input thereto from the lock detector. In the coarse mode the dynamically switchable divider circuit 24 divides by a factor of $2^n$, and the switchable feedback divider 26 divides by a factor N. In a fine lock mode, when the control signal is asserted by the lock detector the dynamically switchable divider circuit 24 does not change the frequency of the incoming signal and the switchable feedback divider divides by a factor N', such that N' is approximately equal to the product of N and $2^n$. n, N, M and N' are integer values.

In this way the ratio between the feedback division factor and the pre-division factor is substantially unchanged regardless of the operation mode of the phase locked loop. This embodiment advantageously allows a simple divider that divides by $2^n$, with high frequency response, to receive the signal output by the VCO in the coarse mode of operation, wherein the output of the VCO may be at the VCO maximum output frequency. Thus the characteristics of the feedback divider are decorrelated from the characteristics of the VCO.

Figure 3:
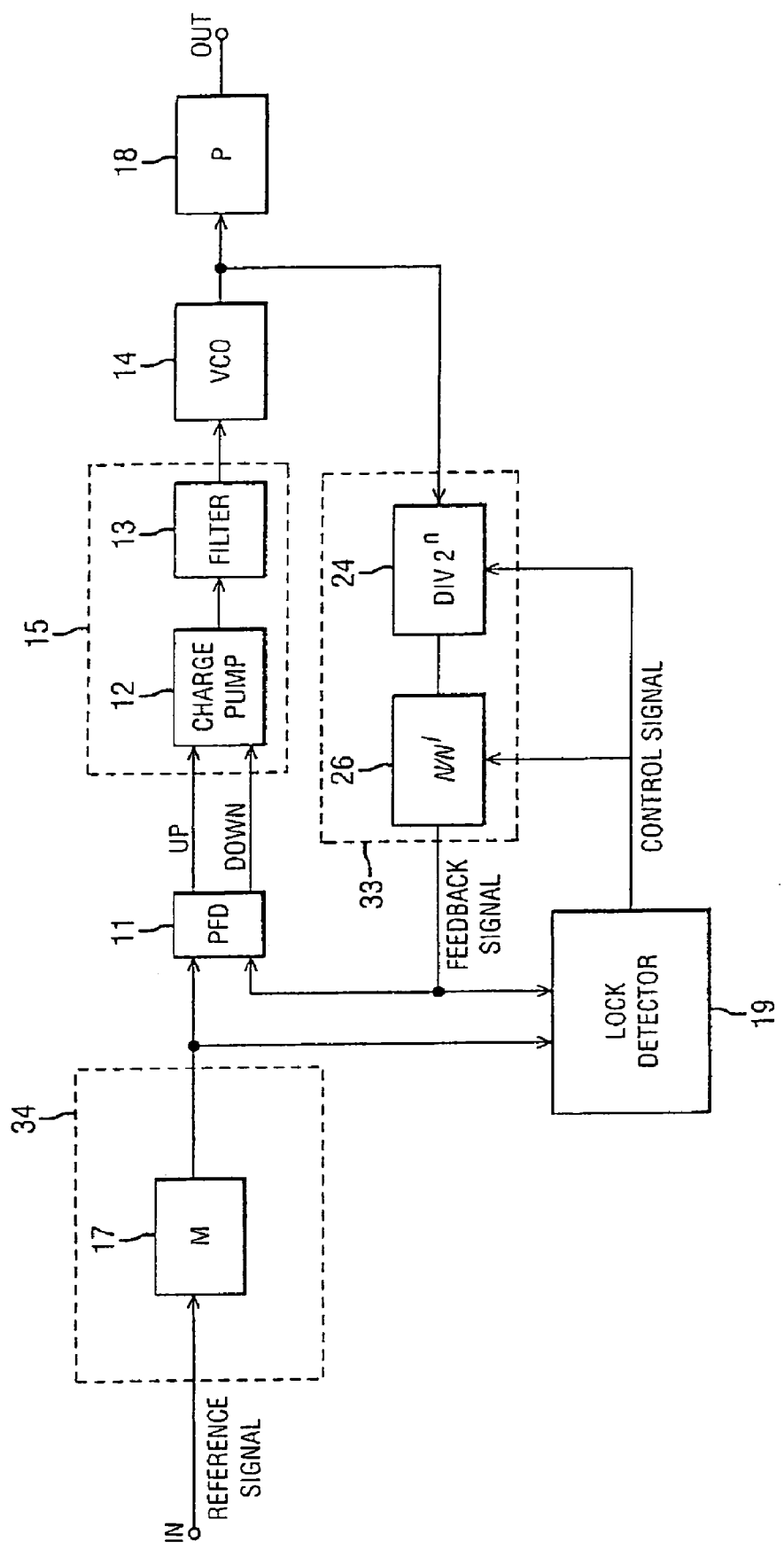
FIG. 3 is a schematic diagram of an alternative embodiment of a PLL circuit embodifying the invention.
Figure 5:
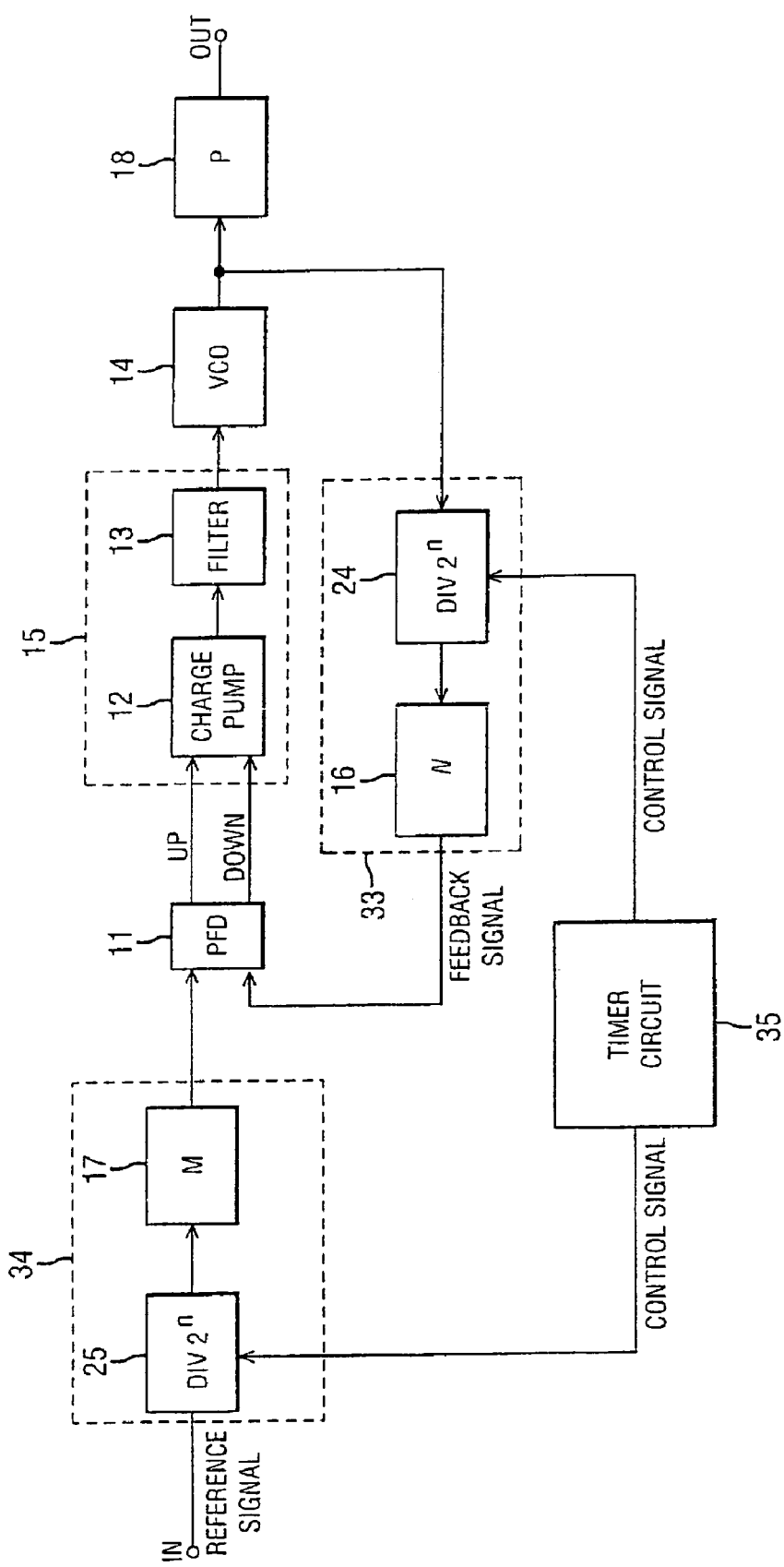
FIG. 5 is a schematic diagram of an alternative embodiment of a PLL circuit according to the invention, incorporating a timing circuit.

In another alternative embodiment of the invention, shown in FIG. 5, the lock detector 19 shown in FIG. 2 or FIG. 3 is replaced by a timer circuit 35. The timer circuit generates and outputs the control signal to the dynamically switchable divider circuit(s) but does not receive the pre-divided input reference signal or the divided feedback signal. Upon start up or reset of the PLL, the timer does not assert the control signal. Once a predetermined time interval has elapsed after start up or reset of the PLL, the timer circuit then asserts the control signal to the dynamically switchable divider circuit(s).

As such this embodiment provides a PLL with two lock modes as described above. The PLL remains in the coarse lock mode for a predetermined time interval, in which time the circuit establishes a coarse lock. It should be appreciated that the predetermined time interval is determined such that the PLL reaches a coarse lock such that the frequencies of the pre-divided input reference signal and the divided feedback signal are close enough that the PLL may achieve lock in the fine lock mode.

An error may occur in the transition from the coarse lock mode to the fine lock mode, however this should be no more than one clock cycle, that is not significant enough to cause the lock detector to de-assert the control signal forcing a transition back to the coarse lock mode. In order to improve the stability and/or functional range of the phase locked loop described above the lock detector may incorporate hysteresis. The lock detector may count for a particular number of pulses once a certain level of lock is detected and ensure the certain level of lock is maintained for the particular number of pulses before changing the state of the control signal.

The feedback divider 16 or switchable feedback divider 26 as described above may be synthesised. This consequently allows a phase locked loop design to be realised very quickly for any particular requirements as the VCO, pre-divider and feedback divider properties can be changed as required. This is due to the de-correlation of VCO maximum frequency from divider complexity.

Embodiments of the present invention thus solve the problem of decorrelating the VCO maximum frequency from the divider properties, thus reducing the design time for designing a PLL and reducing costs.

Further, embodiments of the present invention may provide a PLL that has both a fine frequency resolution and a high output frequency.

Although the present invention has been described in detail, those skilled in the art should understand that they could make various changes, substitutions and alterations herein without departing from the scope of the invention in its broadest form. It is intended that the present invention encompass such changes and modifications as fall within the scope of the appended claims.

What is claimed is:

1. A phase locked loop (PLL) circuit comprising:
   feedback division circuitry for receiving an output signal, the feedback division circuitry arranged to divide the output signal by a first division factor in a first mode of operation, and a second division factor in a second mode of operation;
   a switchable feedback divider for dividing signal input to the feedback division circuitry by a mode-specific factor; and
   a dynamically switchable divider circuit for dividing signal input to the feedback division circuitry responsive to a control signal.

2. A circuit as claimed in claim 1, further comprising:
   pre-division circuitry for receiving a reference signal, the pre-division circuitry arranged to divide the reference signal by a third division factor in the first mode of operation, and a fourth division factor in the second mode of operation.

3. A circuit as claimed in claim 2, wherein the ratio of the first and third factors is substantially the same as the ratio of the second and fourth factors.

4. A circuit as claimed in claim 2, further comprising lock detection circuitry for receiving the pre-divided reference signal and the feedback signal, configured to assert a control signal when the reference signal and the output signal are within a predetermined frequency of each other.

5. A circuit as claimed in claim 2, further comprising timer circuitry configured to assert a control signal after a predetermined amount of time has elapsed since start up of the phase locked loop circuit.

6. A circuit as claimed in claim 2, further comprising timer circuitry configured to assert a control signal after a predetermined amount of time has elapsed since reset of the phase locked loop circuit.

7. A circuit as claimed in claim 4, wherein:
   in the first mode of operation the control signal is not asserted; and
   in the second mode of operation the control signal is asserted.

8. A circuit as claimed in claim 4, wherein the feedback division circuitry further comprises:
   a dynamically switchable divider circuit for dividing the signal input thereto by a first power of two responsive to the control signal.

9. A circuit as claimed in claim 4, wherein the pre-division circuitry comprises:
   a pre-divider for dividing the signal input thereto by a factor;
   a second dynamically switchable divider circuit for dividing the signal input thereto by a second power of two responsive to the control signal.

10. A circuit as claimed in claim 9, wherein the first and second powers of two are equal.

11. A circuit as claimed in claim 2, wherein the pre-divided reference signal and the feedback signal are input to a phase frequency detector (PFD), which generates a PFD signal.

12. A circuit as claimed in claim 1, wherein the output signal is generated by a controlled oscillator.

13. A circuit as claimed in claim 12, wherein the controlled oscillator is a voltage controlled oscillator.

14. A circuit as claimed in claim 12, wherein the controlled oscillator receives the PFD signal, and is responsive to the PFD signal.

15. A circuit as claimed in claim 14, further comprising integration circuitry for modifying the PFD signal prior to it being received by the controlled oscillator.

16. A circuit as claimed in claim 1, further comprising post division circuitry for dividing the output signal by a fifth factor to generate an output of the PLL.

17. A circuit as claimed in claim 4, wherein the lock detection circuitry incorporates hysteresis.

18. A phase locked loop (PLL) circuit comprising:
   feedback division circuitry for receiving an output signal, the feedback division circuitry arranged to divide the output signal by a first division factor in a first mode of operation, and a second division factor in a second mode of operation;
   a switchable feedback divider for dividing by a first integer value in the first mode of operation and the second integer value in a second mode of operation; and
   a dynamically switchable divider circuit for dividing signal input to the feedback division circuitry by a power of two in the first mode of operation.

19. A circuit as claimed in claim 18 wherein the first and second division factors of the pre-division circuitry are equal.

20. A circuit as claimed in claim 18 wherein the second integer is substantially equal to the product of the first integer and the power of two.

21. A circuit as claimed in claim 18, wherein the first and second division factors of the pre-division circuitry are substantially equal.

22. A phase locked loop (PLL) circuit comprising:
   feedback division circuitry for receiving an output signal, the feedback division circuitry arranged to divide the output signal by a first division factor in a first mode of operation, and a second division factor in a second mode of operation;
   a switchable feedback divider for dividing signal input to the feedback division circuitry by a mode-specific factor;
   a dynamically switchable divider circuit for dividing signal input to the feedback division circuitry responsive to a control signal; and
   pre-division circuitry for receiving a reference signal, the pre-division circuitry arranged to divide the reference signal by a third division factor in the first mode of operation, and a fourth division factor in the second mode of operation, wherein the ratio of the first and third factors is substantially the same as the ratio of the second and fourth factors.

23. A circuit as claimed in claim 22, further comprising lock detection circuitry for receiving the pre-divided reference signal and the feedback signal, configured to assert a control signal when the reference signal and the output signal are within a predetermined frequency of each other.

24. A circuit as claimed in claim 23, wherein the lock detection circuitry incorporates hysteresis.

* * * * *